(12) United States Patent
Lee

(10) Patent No.: US 8,163,129 B2
(45) Date of Patent: Apr. 24, 2012

(54) METHOD AND APPARATUS FOR CLEANING A SUBSTRATE

(75) Inventor: Se-Won Lee, Cheonan-si (KR)

(73) Assignee: Semes Co., Ltd., Chungnam (KR)

( * ) Notice: Subject to any disclaimer, the term of this patent is extended or adjusted under 35 U.S.C. 154(b) by 339 days.

(21) Appl. No.: 12/243,277

(22) Filed: Oct. 1, 2008

(65) Prior Publication Data
US 2009/0084399 A1 Apr. 2, 2009

(30) Foreign Application Priority Data

Oct. 2, 2007 (KR) .................. 10-2007-0099073

(51) Int. Cl.
*H01L 21/306* (2006.01)
*C23F 1/00* (2006.01)
*B23K 26/00* (2006.01)

(52) U.S. Cl. ................. 156/345.5; 219/121.68
(58) Field of Classification Search .......... 156/345.5; 219/121.68
See application file for complete search history.

(56) References Cited

U.S. PATENT DOCUMENTS

| | | | | |
|---|---|---|---|---|
| 5,097,525 | A * | 3/1992 | Garcia et al. | 385/75 |
| 5,531,857 | A * | 7/1996 | Engelsberg et al. | 156/345.5 |
| 5,780,806 | A * | 7/1998 | Ferguson et al. | 219/121.68 |
| 6,136,256 | A * | 10/2000 | Bingham et al. | 264/437 |
| 6,178,973 | B1 * | 1/2001 | Franca et al. | 134/1.3 |
| 6,232,580 | B1 * | 5/2001 | Sandhu | 219/390 |
| 6,419,996 | B2 * | 7/2002 | Mueller et al. | 427/554 |
| 2002/0170892 | A1 * | 11/2002 | Lee et al. | 219/121.68 |
| 2003/0106881 | A1 | 6/2003 | Lee et al. | |
| 2006/0092536 | A1 * | 5/2006 | Hayashi | 360/17 |

FOREIGN PATENT DOCUMENTS

| | | |
|---|---|---|
| JP | 63-043324 | 2/1988 |
| JP | 2000-061414 | 2/2000 |
| JP | 2001/2300239 | 8/2001 |
| JP | 2003-171757 | 6/2003 |

OTHER PUBLICATIONS

Chinese Office Action dated Feb. 5, 2010 for counterpart Chinese Patent Application No. 200810165891.0, filed on Oct. 6, 2008, for priority Korean application, from which present U.S. Application claims priority.
First Office Action for the Chinese Publication No. PRC 2008101658910 from the State International Patent Office dated Aug. 21, 2009 for counterpart Chinese patent application and English translation of Chinese Office Action.
Japanese Office Action dated May 17, 2011 for Japanese Patent Application No. 2008-257351 and English reporting letter, 5 pages.

* cited by examiner

*Primary Examiner* — Keath Chen
(74) *Attorney, Agent, or Firm* — Daly, Crawford, Mofford & Durkee, LLP

(57) ABSTRACT

In a method and an apparatus for cleaning a substrate using a laser beam, an inner chamber is disposed in a process chamber to define a space in which a laser-induced shock wave is generated. The laser beam is focused on a laser focus positioned in the inner chamber, and thus the laser-induced plasma shock wave is generated around the laser focus. The plasma shock wave is reflected from inner surfaces of the inner chamber and is irradiated on the substrate through a lower portion of the inner chamber. As a result, the intensity of the plasma shock wave irradiated on the substrate is increased, and thus the contaminants on the substrate may be effectively removed.

15 Claims, 3 Drawing Sheets

METHOD AND APPARATUS FOR CLEANING A SUBSTRATE

PRIORITY STATEMENT

This application claims priority under 35 U.S.C. §119 to Korean Patent Application No. 2007-99073, filed on Oct. 2, 2007 in the Korean Intellectual Property Office (KIPO), the contents of which are herein incorporated by reference in their entirety.

BACKGROUND

1. Field

The example embodiments generally relate to a method and an apparatus for cleaning a substrate. More particularly, the example embodiments relate to a method of cleaning a substrate to remove contaminants on the substrate using a laser-induced shock wave, and an apparatus for performing the same.

2. Description of the Related Art

Integrated circuit devices such as semiconductor devices, flat panel display devices, and the like are generally manufactured through various processes. For example, a series of unit processes such as a deposition process, an etching process, a cleaning process, and the like may be performed on a substrate such as a semiconductor substrate or a glass substrate. Particularly, the cleaning process may be performed to remove contaminants on the substrate.

Examples of an apparatus for cleaning a substrate are disclosed in U.S. Laid-Open Patent Publication Nos. 2002-0170892 and 2003-0106881.

A conventional apparatus for cleaning a substrate includes a laser for generating a laser beam, reflecting mirrors for directing the laser beam onto a laser focus positioned over the substrate, and a focusing lens for focusing the laser beam onto the laser focus, etc.

However, a laser-induced plasma shock wave generated around the laser focus may collide with inner surfaces of a chamber in which the substrate is placed and elements disposed in the chamber as well as the substrate. Thus, the inner surfaces of the chamber and the elements may be damaged. Further, since the plasma shock wave is irradiated in all directions, energy efficiency may be deteriorated, and the time required to perform the cleaning process on the entire surface of the substrate may be increased.

SUMMARY

Example embodiments of the present invention provide a method of cleaning a substrate capable of improving energy efficiency and preventing a chamber from being damaged by a laser-induced plasma shock wave.

Further, example embodiments of the present invention provide an apparatus for cleaning a substrate capable of improving energy efficiency and preventing a chamber from being damaged by a laser-induced plasma shock wave.

A method of cleaning a substrate, in accordance with an aspect of the present invention, may include generating a laser beam, focusing the laser beam on a laser focus to generate a plasma shock wave, the laser focus being positioned over the substrate, condensing the plasma shock wave, and irradiating the condensed plasma shock wave onto the substrate to remove contaminants from the substrate.

According to some example embodiments of the present invention, the substrate may be supported by a substrate support section disposed in a process chamber, and the laser focus may be positioned in an inner chamber disposed over the substrate support section in the process chamber.

According to some example embodiments of the present invention, the plasma shock wave may be condensed by being reflected from inner surfaces of the inner chamber and may be irradiated onto the substrate through a lower portion of the inner chamber.

According to some example embodiments of the present invention, a process gas may be supplied into the inner chamber.

According to some example embodiments of the present invention, the substrate may be moved to clean the entire upper surface of the substrate.

An apparatus for cleaning a substrate, in accordance with another aspect of the present invention, may include a process chamber, a substrate support section disposed in the process to support the substrate, a beam irradiator generating a laser beam and focusing the laser beam on a laser focus to generate a plasma shock wave, the laser focus being positioned over the substrate support section, and an inner chamber disposed over the substrate support section in the process chamber, the inner chamber defining a space in which the laser focus is positioned and having a lower opening to irradiate the plasma shock wave onto the substrate so as to remove contaminants from the substrate.

According to some example embodiments of the present invention, the beam irradiator may include a laser generating the laser beam, at least one reflecting mirror reflecting the laser beam, and a focusing lens focusing the laser beam reflected by the reflecting mirror on the laser focus.

According to some example embodiments of the present invention, the reflecting mirror may be movable.

According to some example embodiments of the present invention, the inner chamber may be formed of stainless steel.

According to some example embodiments of the present invention, inner surfaces of the inner chamber may be plated with gold to reflect the plasma shock wave.

According to some example embodiments of the present invention, the inner chamber may have a transparent window to transmit the laser beam.

According to some example embodiments of the present invention, the transparent window may be formed of quartz or glass and may have a thickness of about 1 to about 5 mm.

According to some example embodiments of the present invention, the apparatus may further include a gas supply section connected to the inner chamber to supply a process gas into the inner chamber.

According to some example embodiments of the present invention, the apparatus may further include a flow control valve disposed on a gas supply pipe that connects the inner chamber with the gas supply section to control the flow rate of the process gas.

According to some example embodiments of the present invention, the apparatus may further include a shock wave irradiator communicating with the lower opening of the inner chamber and irradiating the plasma shock wave onto the substrate.

According to some example embodiments of the present invention, the shock wave irradiator may include a shock wave irradiating tube communicating with the lower opening of the inner chamber and a control valve disposed on the shock wave irradiating tube to control the intensity of the plasma shock wave transmitted through the shock wave irradiating tube.

According to some example embodiments of the present invention, the apparatus may further include a driving section connected to the substrate support section to rotate the substrate support section and to move the substrate support section in horizontal and vertical directions.

According to some example embodiments of the present invention, the apparatus may further include a vacuum evacuator removing the contaminants from the process chamber.

According to some example embodiments of the present invention, the apparatus may further include a condensing mirror disposed in the inner chamber to reflect the plasma shock wave toward the substrate.

In accordance with the example embodiments of the present invention, since the plasma shock wave is reflected by the inner surfaces of the inner chamber, the intensity of the plasma shock wave irradiated onto the substrate may be increased, and the cleaning efficiency of the substrate may thus be improved. Further, energy efficiency may be improved, and damage to the inner surfaces of the process chamber and elements disposed in the process chamber caused by the plasma shock wave may be reduced.

BRIEF DESCRIPTION OF THE DRAWINGS

Example embodiments of the present invention will become readily apparent along with the following detailed description when considered in conjunction with the accompanying drawings, in which.

DESCRIPTION OF THE EMBODIMENTS

Figure 1:
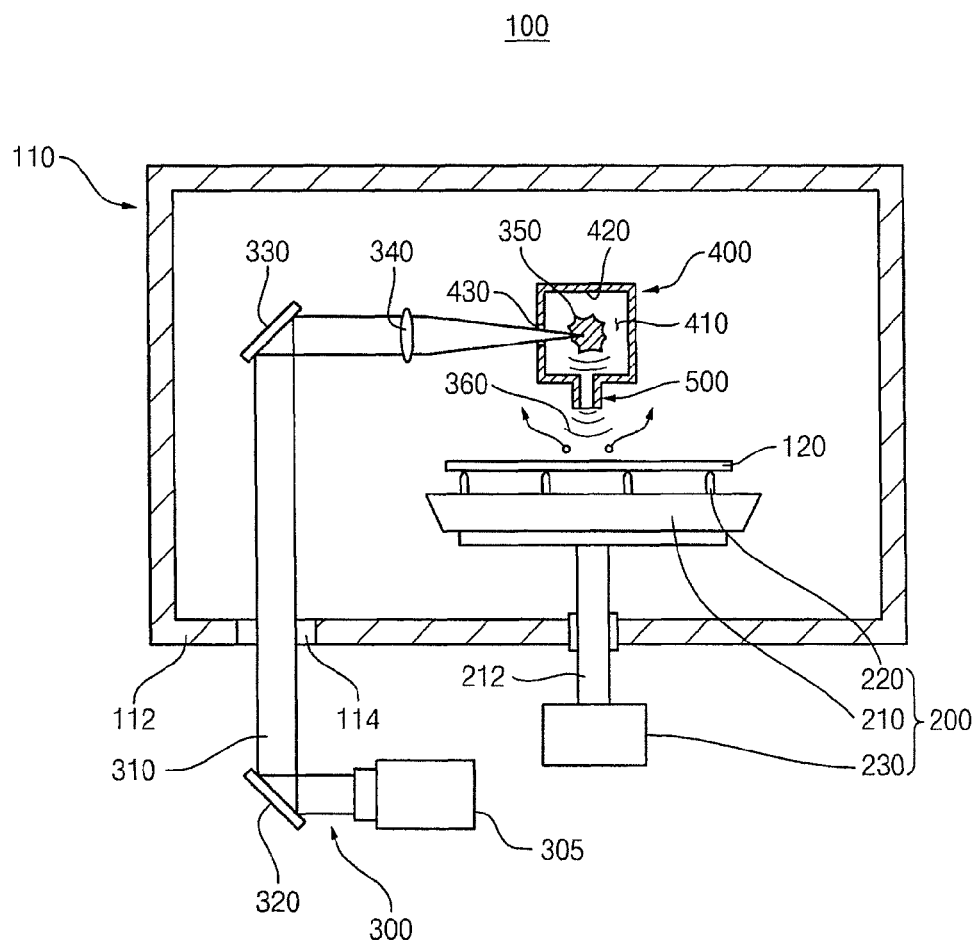
FIG. 1 is a schematic cross-sectional view illustrating an apparatus for cleaning a substrate in accordance with an example embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the present invention are described herein with reference to cross-sectional illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present invention.

FIG. 1 is a schematic cross-sectional view illustrating an apparatus for cleaning a substrate in accordance with an example embodiment of the present invention.

Referring to FIG. 1, an apparatus 100 for cleaning a substrate, in accordance with an example embodiment of the present invention, may include a process chamber 110, a substrate support section 200, a beam irradiator 300, an inner chamber 400 and a shock wave irradiator 500.

The process chamber 110 may provide a space for cleaning a substrate 120. For example, the process chamber 110 may have a rectangular parallelepiped shape having a space therein. Alternatively, the process chamber 110 may have various shapes having a space therein.

The substrate support section 200 may be disposed to support the substrate 120. For example, the substrate support section 200 may support edge portions of the substrate 120.

The substrate support section 200 may include a spin chuck 210, a plurality of support pins 220 disposed on the spin chuck 210 to support the edge portions of the substrate 120, and a driving section 230 for rotating and moving the spin chuck 210.

The spin chuck 210 may have a size equal to or greater than that of the substrate 120. Further, the spin chuck 210 may be connected to the driving section 230 by a driving shaft 212.

The support pins 220 may be disposed on edge portions of an upper surface of the spin chuck 210 to support the edge portions of the substrate 120. According to another example embodiment of the present invention, a plurality of holders (not shown) may be disposed on the edge portions of the spin chucks 210 to hold the edge portions of the substrate 120.

The driving section 230 may rotate the spin chuck 210. That is, the supported substrate 120 may be rotated by rotation of the spin chuck 210. Further, the driving section 230 may move the spin chuck 210. For example, the driving section 230 may move the spin chuck 210 in horizontal and vertical directions to adjust the position of the substrate 120. Particularly, the driving section 230 may move the spin chuck 210 in the vertical direction to adjust the distance between a laser focus 350 and the substrate 120 and may further move the spin chuck 210 in the horizontal direction so that a plasma shock wave is irradiated onto the entire upper surface of the substrate 120.

The beam irradiator 300 may include a laser 305, a first reflecting mirror 320, a second reflecting mirror 330 and a focusing lens 340.

The laser 305 may be disposed outside the process chamber 110. Alternatively, the laser 305 may be disposed in the process chamber 110.

The laser 305 may be used to generate a laser beam 310, which may be focused on a laser focus 350 positioned over the substrate 120. For example, the laser beam 310 generated by the laser 305 may include a pulse wave having a high energy. The laser beam 310 may have a pulse width of about 1 to about 100 ns and an output energy of about 0.1 to about 10 J/pulse. The laser beam 310 may be focused on the laser focus 350 by the focusing lens 340, and a plasma shock wave 360 may thus be generated. For example, the laser 305 may be an Nd:YAG laser or a $CO_2$ laser.

The first and second reflecting mirrors 320 and 330 may be used to direct the laser beam 310 onto the focusing lens 340.

The first reflecting mirror 320 may be disposed adjacent to the laser 305 outside the process chamber 110. The laser beam 310 reflected by the first reflecting mirror 320 may be directed onto the second reflecting mirror 330, and the laser beam 310 reflected by the second reflecting mirror 330 may then be directed onto the focusing lens 340.

Meanwhile, the process chamber 110 may have a first transparent window 114 to transmit the laser beam 310. For example, the first transparent window 114 may be disposed in a lower panel 112 of the process chamber 110.

The first and second reflecting mirrors 320 and 330 may be movably disposed to change the position of the laser focus 350. Meanwhile, the beam irradiator 300 may further include various optical elements, and the scope of the present invention is not limited by the first and second reflecting mirrors 320 and 330.

The focusing lens 340 may be used to focus the laser beam 310 on the laser focus 350. That is, the laser beam 310 reflected by the second reflecting mirror 330 may be directed onto the focusing lens 340 and may then be focused on the laser focus 350.

The laser beam 310 focused on the laser focus 350 may generate a plasma shock wave around the laser focus 350 due to a breakdown of gas particles, and the plasma shock wave may be propagated in all directions from the laser focus 350.

A portion of the plasma shock may be irradiated onto the substrate, and contaminants, for example, particles, organic contaminants, and the like, may thus be removed from the substrate. Further, the plasma shock wave may be irradiated onto inner surfaces of the process chamber 110 and elements disposed in the process chamber 110, and the process chamber 110 and the elements may thus be damaged.

In accordance with some example embodiments of the present invention, an inner chamber 400 may be disposed in the process chamber 110 to block the plasma shock wave and to define a space 410 in which the laser focus 350 is positioned. The inner chamber 400 may have a second transparent window 430 to transmit the laser beam 310. For example, the laser beam 310 passing through the focusing lens 340 may be directed onto the laser focus 350 through the second transparent window 430.

The plasma shock wave radiated from the laser focus 350 may be reflected by inner surfaces 420 of the inner chamber 400, and a portion of the reflected plasma shock wave may be irradiated onto the substrate 120 through a lower portion of the inner chamber 400. Thus, the intensity of the plasma shock wave irradiated onto the substrate 120 may be increased.

A shock wave irradiator 500 may be connected to the lower portion of the inner chamber 400 to irradiate the plasma shock wave onto the substrate 120. The shock wave irradiator 500 may have a cylindrical shape. Particularly, the inner chamber 400 may have a lower opening, and the plasma shock wave may be irradiated onto the substrate 120 through the lower opening and the shock wave irradiator 500.

As a result, the plasma shock wave may be condensed in the inner chamber 400, and the condensed plasma shock wave having the increased intensity may be irradiated on the substrate 120. Thus, the contaminants may be effectively removed from the substrate 120, and the energy efficiency of the laser beam 310 may be improved.

In accordance with another example embodiment of the present invention, although not shown in figures, a condensing mirror may be disposed in the inner chamber 110 to reflect a portion of the plasma shock wave radiated from the laser focus 350 toward the substrate 120. The condensing mirror may be disposed over the laser focus 350. For example, the condensing mirror may have a hemispherical shape or a conical shape. Further, the condensing mirror may be formed of stainless steel, and surfaces of the condensing mirror may be plated with gold.

Figure 2:
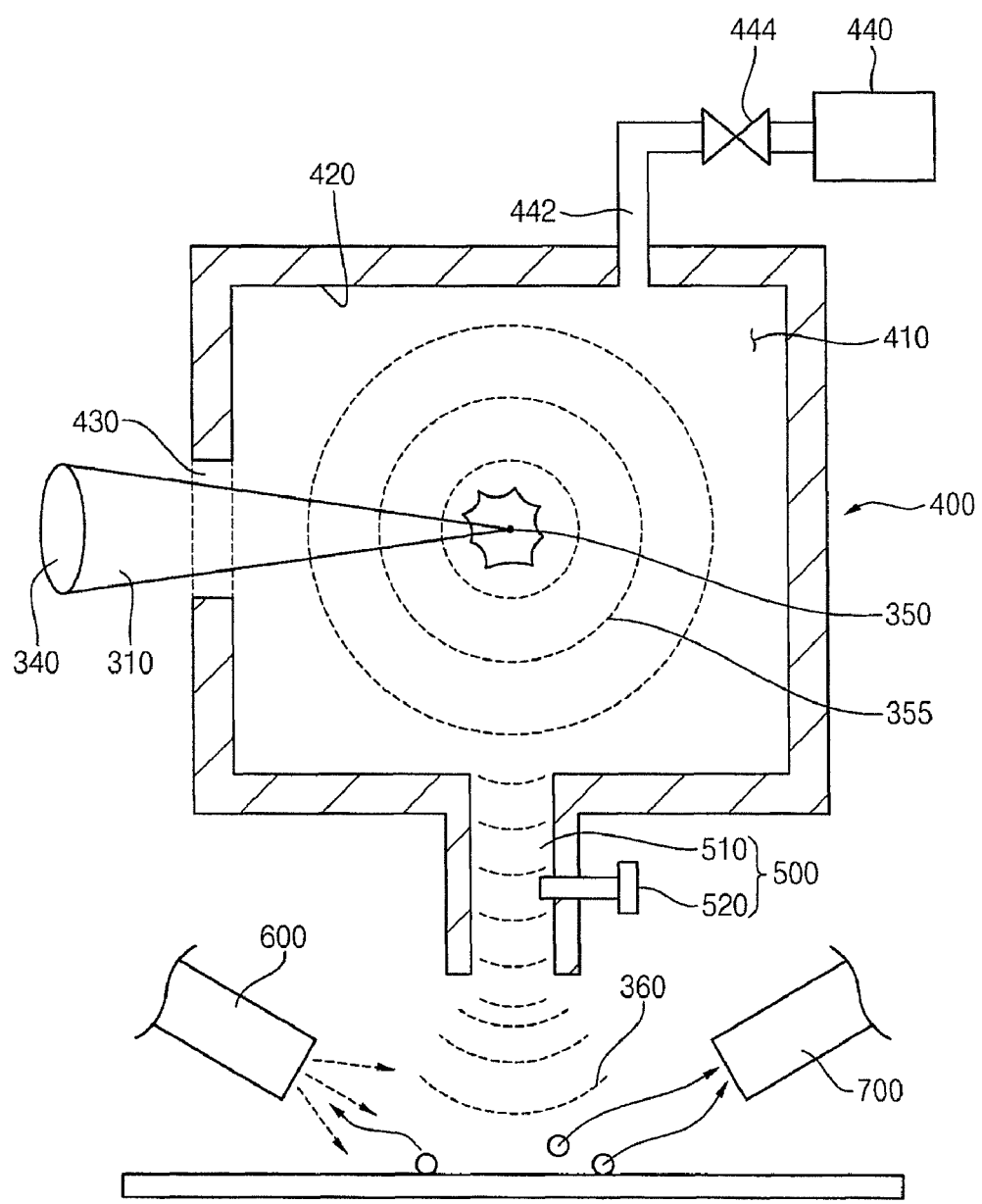
FIG. 2 is a schematic cross-sectional view illustrating an inner chamber shown in FIG. 1.

FIG. 2 is a schematic cross-sectional view illustrating the inner chamber shown in FIG. 1.

Referring to FIG. 2, the inner chamber 400 may be disposed over the substrate support section 200 in the process chamber 110 to irradiate the plasma shock wave 355 onto the substrate 120. Particularly, the inner chamber 400 may surround the laser focus 350. That is, the inner chamber 400 may define the space 410 in which the laser focus 350 is positioned, and may partially block out the plasma shock wave 355 to prevent the inner surfaces of the process chamber 110 and the elements in the process chamber 110 from being damaged by the plasma shock wave 355 radiated from the laser focus 350.

The inner chamber 400 may be formed of stainless steel. Particularly, the inner surfaces 420 of the inner chamber 400 may be plated with gold so as to reflect the plasma shock wave 355 without being damaged by the plasma shock wave 355.

The inner chamber 400 may have the second transparent window 430 to transmit the laser beam 310 passing through the focusing lens 340. The second transparent window 430 may be formed of quartz or glass and may have a thickness of about 1 to about 5 mm to reduce loss of the laser beam 310.

A gas supply section 440 may be connected to the inner chamber 400 to supply a process gas into the inner chamber 400.

The gas supply section 440 may be connected to the inner chamber 400 by a gas supply pipe 442, and the flow rate of the process gas supplied into the chamber 400 may be controlled by a flow control valve 444 disposed on the gas supply pipe 442.

Examples of the process gas may include an inert gas such as argon, nitrogen, helium, neon, and the like or a reactive gas such as oxygen, ozone, fluorine, chlorine, and the like. Further, a gas mixture of the inert gas and the reactive gas may be used as the process gas. Particularly, the inert gas may be used to remove particles on the substrate 120, and the reactive gas may be used to remove organic contaminants on the substrate 120.

The shock wave irradiator 500 may be connected to the lower portion of the inner chamber 400. The shock wave irradiator 500 may be disposed adjacent to the substrate 120 and may include a shock wave irradiating tube 510 for transmitting the plasma shock wave 355 onto the substrate 120 and a control valve 520 for controlling the intensity of the plasma shock wave 360 irradiated onto the substrate 120. The shock wave irradiating tube 510 may communicate with the lower opening the inner chamber 400, and the plasma shock wave 360 may be irradiated onto the substrate 120 through the lower opening and the shock wave irradiating tube 510.

The shock wave irradiating tube 510 may be formed of the same material as that of the inner chamber 400. For example, the shock wave irradiating tube 510 may be formed of stainless steel, and an inner surface of the shock wave irradiating tube 510 may be plated with gold so as to transmit the plasma shock wave 360 onto the substrate 120.

The control valve 520 may be disposed on the shock wave irradiating tube 510 to adjust the opening degree of the shock wave irradiating tube 510. That is, a cross-sectional area of a channel through which the plasma shock wave 360 is transmitted may be adjusted by the control valve 520, and the intensity of the plasma shock wave 360 irradiated onto the substrate 120 may thus be adjusted.

As described above, the intensity of the plasma shock wave 360 irradiated onto the substrate 120 may be increased because the plasma shock wave 355 radiated from the laser focus 350 is reflected from the inner surfaces 420 of the inner chamber 400. Thus, the contaminants on the substrate 120 may be easily removed. Further, because the plasma shock wave 355 is reflected, the inner surfaces of the process chamber 110 and the elements in the process chamber 110 may be prevented from being damaged by the plasma shock wave 355.

Meanwhile, the substrate 120 may be rotated or moved by the driving section 230 while the plasma shock wave 360 is irradiated onto the substrate 120. Thus, the cleaning process on the entire upper surface of the substrate 120 may be suitably performed.

Further, the substrate cleaning apparatus 100 may further include a second gas supply section 600 and a vacuum evacuator 700. The second gas supply section 600 may supply an inert gas onto the substrate 120 so as to remove the contaminants from the substrate 120, and the vacuum evacuator 700 may be used to remove the contaminants separated from the substrate 120 along with the inert gas and the process gas from the process chamber 110. The vacuum evacuator 700 may include a vacuum pump, a vacuum pipe, a pressure control valve, etc.

As shown in FIG. 2, although the second gas supply section 600 and the vacuum evacuator 700 are disposed adjacent to a portion of the substrate 120 onto which the plasma shock wave 360 is irradiated, the second gas supply section 600 and the vacuum evacuator 700 may be connected to the process chamber 110. Alternatively, the vacuum evacuator 700 may only be connected to the process chamber 110 without the second gas supply section 600.

Figure 3:
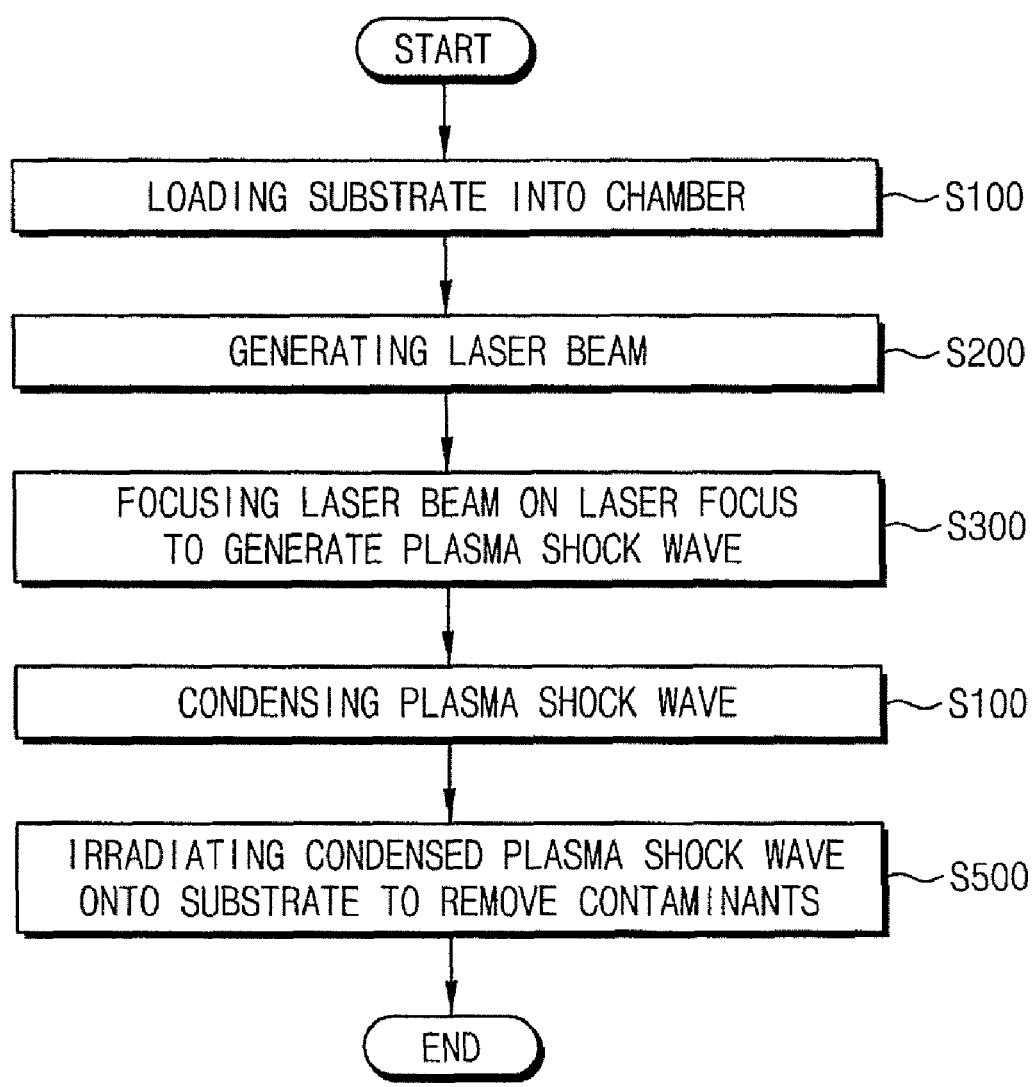
FIG. 3 is a flowchart illustrating a method of cleaning a substrate to remove contaminants from the substrate using the substrate cleaning apparatus shown in FIGS. 1 and 2.

FIG. 3 is a flowchart illustrating a method of cleaning a substrate to remove contaminants from the substrate using the substrate cleaning apparatus shown in FIGS. 1 and 2.

Referring to FIG. 3, a substrate 120 such as a semiconductor substrate or a glass substrate may be loaded onto the substrate support section 200 disposed in the process chamber 110 in step S100. The distance between the substrate 120 and the shock wave irradiator 500 may be adjusted by the driving section 230.

A laser beam 310 may be generated by the laser 305 in step S200. The laser beam 310 may be directed onto the focusing lens 340 by the first and second reflecting mirrors 320 and 330.

A plasma shock wave 355 may be generated by focusing the laser beam 310 on the laser focus 350 in step S300. Particularly, the laser beam 310 may be focused on the laser focus positioned in the inner chamber 400 by the focusing lens 340, and the plasma shock wave 355 may thus be generated around the laser focus 350. Here, a process gas such as an inert gas or a reactive gas may be supplied into the inner chamber 400, and the plasma shock wave 355 may be effectively generated by the process gas.

A plasma shock wave 360 irradiated onto the substrate 120 may be condensed in step S400. Particularly, the plasma shock wave 355 radiated from the laser focus 350 may be reflected from the inner surfaces 420 of the inner chamber 400, and the intensity of the plasma shock wave 360 irradiated onto the substrate 120 may thus be increased.

In accordance with another example embodiment of the present invention, the plasma shock wave 355 radiated from the laser focus 350 may be reflected by a hemispherical or conical condensing mirror, which is disposed over the laser focus 350.

The condensed plasma shock wave 360 may be irradiated onto the substrate 120, and contaminants may thus be removed from the substrate 120. The plasma shock wave 360 may be irradiated through the shock wave irradiator 500, and the driving section 230 may move the substrate 120 in a horizontal direction so as to clean the entire upper surface of the substrate 120. Further, the driving section 230 may rotate the substrate 120 so as to clean the entire upper surface of the substrate 120.

Furthermore, an inert gas may be supplied onto the substrate 120 while cleaning the surface of the substrate 120, and the contaminants separated from the substrate 120 may be removed from the process chamber 110 by the vacuum evacuator 700.

In accordance with the example embodiments of the present invention as described above, a plasma shock wave may be generated by focusing a laser beam on a laser focus. The laser focus may be positioned in an inner chamber, which is disposed over a substrate support section for supporting a substrate, and a shock wave irradiator may be connected to a lower portion of the inner chamber. The plasma shock wave may be reflected from inner surfaces of the inner chamber and may then be irradiated onto the substrate through the shock wave irradiator.

Thus, the intensity of the plasma shock wave irradiated onto the substrate may be increased, and the cleaning efficiency of the substrate may thus be improved. Further, since the plasma shock wave is reflected by the inner surfaces of the inner chamber, energy efficiency may be improved, and damage to inner surfaces of a process chamber and elements disposed in the process chamber caused by the plasma shock wave may be reduced.

Although the example embodiments of the present invention have been described, it is understood that the present invention should not be limited to these example embodiments but various changes and modifications can be made by those skilled in the art within the spirit and scope of the present invention as hereinafter claimed.

What is claimed is:

1. An apparatus for cleaning a substrate, the apparatus comprising:
   a process chamber;
   a substrate support section disposed in the process chamber to support the substrate;
   a beam irradiator generating a laser beam and focusing the laser beam on a laser focus to generate a plasma shock wave, the laser focus being positioned over the substrate support section, the beam irradiator comprising a focusing lens; and
   an inner chamber within the process chamber configured to receive a process gas used to generate the plasma shock wave and disposed over the substrate support section, the inner chamber having a lower opening to irradiate the plasma shock wave onto the substrate so as to remove contaminants from the substrate,
   wherein the focusing lens is outside the inner chamber and the laser focus of the focusing lens is inside the inner chamber.

2. The apparatus of claim 1, wherein the beam irradiator further comprises:
   a laser generating the laser beam; and
   at least one reflecting mirror reflecting the laser beam,
   wherein the focusing lens focuses the laser beam reflected by the reflecting mirror on the laser focus.

3. The apparatus of claim 2, wherein the reflecting mirror is movable.

4. The apparatus of claim 1, wherein the inner chamber is formed of stainless steel.

5. The apparatus of claim 4, wherein inner surfaces of the inner chamber are plated with gold to reflect the plasma shock wave.

6. The apparatus of claim 1, wherein the inner chamber has a transparent window to transmit the laser beam.

7. The apparatus of claim 6, wherein the transparent window is formed of quartz or glass and has a thickness of about 1 to about 5 mm.

8. The apparatus of claim 1, further comprising a gas supply section connected to the inner chamber to supply a process gas into the inner chamber.

9. The apparatus of claim 8, further comprising a flow control valve disposed on a gas supply pipe that connects the inner chamber with the gas supply section to control a flow rate of the process gas.

10. The apparatus of claim 1, further comprising a shock wave irradiator directly coupled to the lower opening of the inner chamber and irradiating the plasma shock wave onto the substrate.

11. The apparatus of claim 10, wherein the shock wave irradiator comprises:
    a shock wave irradiating tube directly coupled to the lower opening of the inner chamber; and
    a control valve disposed on the shock wave irradiating tube to control an intensity of the plasma shock wave transmitted through the shock wave irradiating tube.

12. The apparatus of claim 11 wherein at least a portion of the control valve is outside the inner chamber and inside the process chamber.

13. The apparatus of claim 1, further comprising a driving section connected to the substrate support section to rotate the substrate support section and to move the substrate support section in horizontal and vertical directions.

14. The apparatus of claim 1, further comprising a vacuum evacuator removing the contaminants from the process chamber.

15. The apparatus of claim 1, further comprising a condensing mirror disposed in the inner chamber to reflect the plasma shock wave toward the substrate.

* * * * *